(12) United States Patent
Hellgren et al.

(10) Patent No.: US 6,268,651 B1
(45) Date of Patent: Jul. 31, 2001

(54) ARRANGEMENT FOR MOUNTING A COMPONENT UPSTANDING ON A CARRIER WITH SURFACE MOUNTED LEADS

(75) Inventors: Eva Hellgren, Solna; Mats Eriksson, Järfälla, both of (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 09/442,034

(22) Filed: Nov. 17, 1999

Related U.S. Application Data

(62) Division of application No. 08/977,235, filed on Nov. 24, 1997, now Pat. No. 6,010,920.

(30) Foreign Application Priority Data

Nov. 26, 1996 (SE) .................................................... 9604345

(51) Int. Cl.⁷ .................................................... H01L 23/48
(52) U.S. Cl. .......................... 257/692; 257/696; 257/698; 257/774
(58) Field of Search ................................ 257/668, 692, 257/696, 697, 698, 774, 784; 351/772, 773, 813

(56) References Cited

U.S. PATENT DOCUMENTS

| | | |
|---|---|---|
| 2,911,609 | 11/1959 | Burtt et al. .......................... 439/636 |
| 3,793,720 | 2/1974 | Van Rijsewijk et al. .............. 29/837 |
| 5,295,298 | 3/1994 | Sakamoto ............................. 29/827 |
| 5,398,165 * | 3/1995 | Niinou ................................. 361/774 |
| 5,518,964 | 5/1996 | DiStefano ........................... 438/113 |
| 5,557,145 | 9/1996 | Kobayashi et al. ................. 257/692 |
| 5,629,839 * | 5/1997 | Woychik ............................. 361/803 |
| 5,635,760 * | 6/1997 | Ishikawa ............................ 257/696 |

FOREIGN PATENT DOCUMENTS

| | | |
|---|---|---|
| 1257235 | 12/1967 | (DE) . |
| 2459307 | 6/1976 | (DE) . |
| 374479 | 10/1972 | (SE) . |
| 387816 | 9/1976 | (SE) . |

* cited by examiner

Primary Examiner—Minh Loan Tran
(74) Attorney, Agent, or Firm—Burns, Doane, Swecker & Mathis, L.L.P.

(57) ABSTRACT

There is a trend in the electronics industry towards a preference for components that can be surface mounted on a carrier, such as a circuit board. By using surface mountable leads on a component together with a "Single-In-Line" technique it is possible to surface mount a component (5) upstanding on a circuit board (7) with the component leads surface mounted on the board. The leads (8) may be bent at their bottom extremities and provided with feet (10) for effective contact with the board. Guide and support pins may be used to hold the component in position during mounting and connecting the component and to brace the leads on the component when mounted on the board.

9 Claims, 2 Drawing Sheets

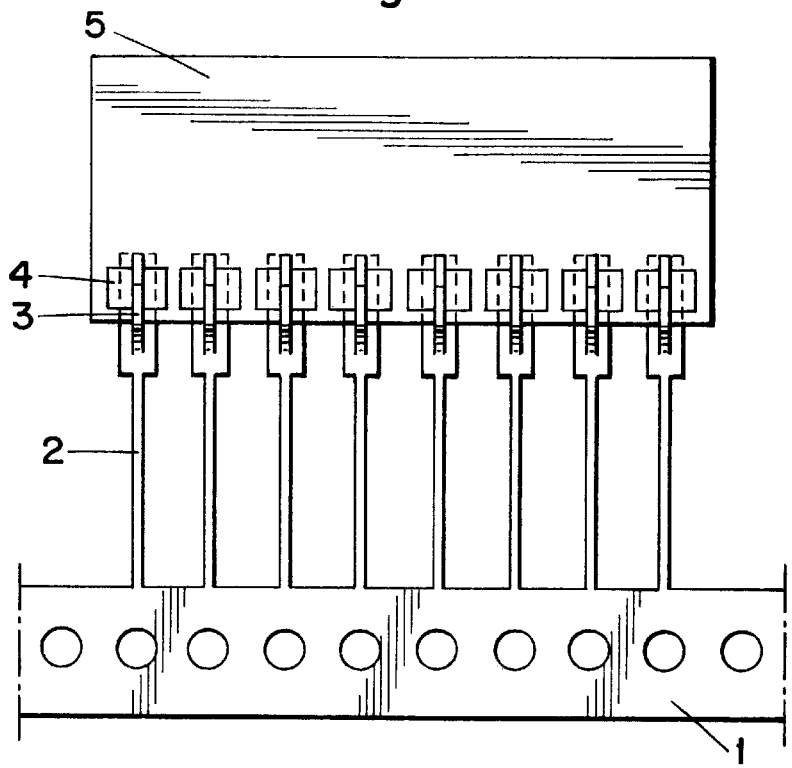
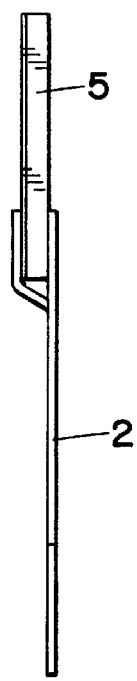
Fig. 1A   Fig. 1B
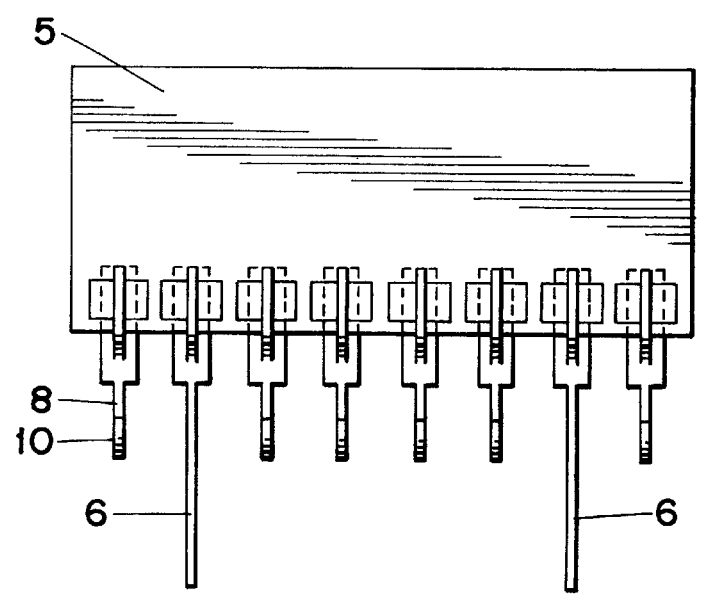
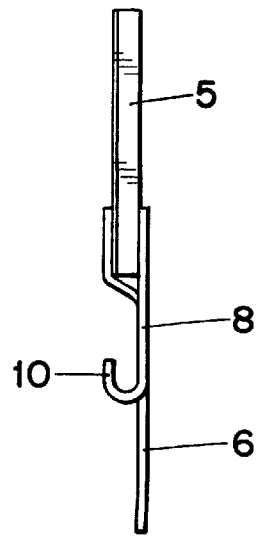
Fig. 2A   Fig. 2B

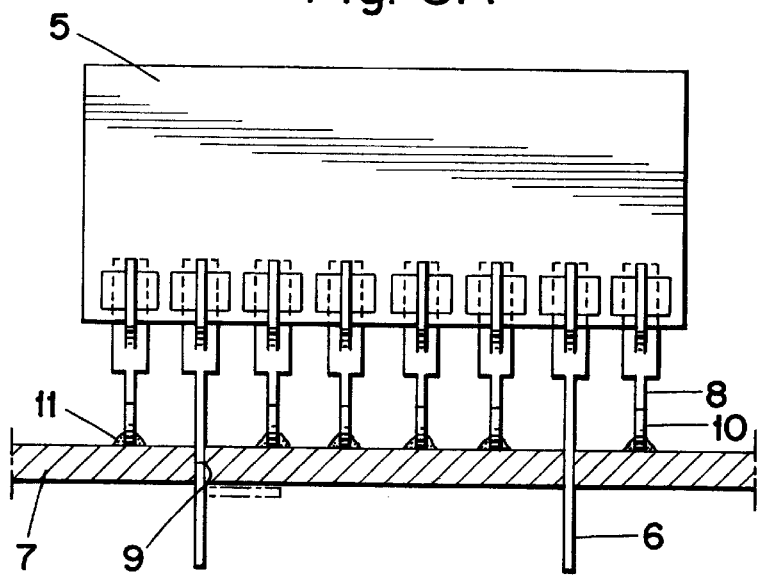
Fig. 3A
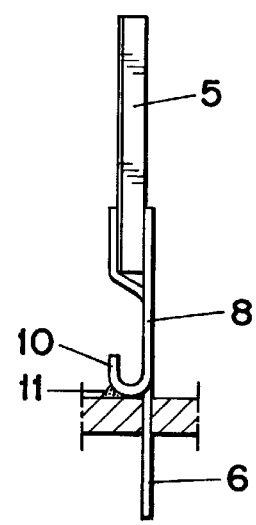
Fig. 3B
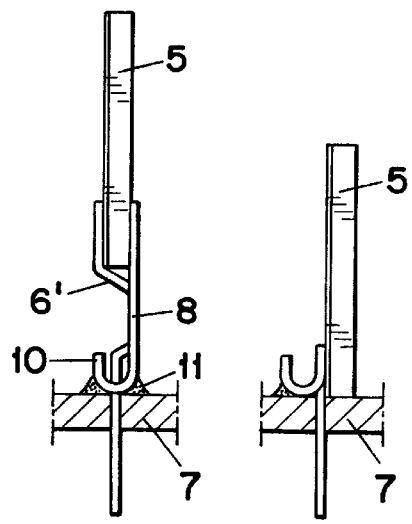
Fig. 4A
Fig. 4B
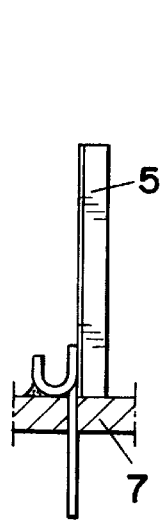
Fig. 5A
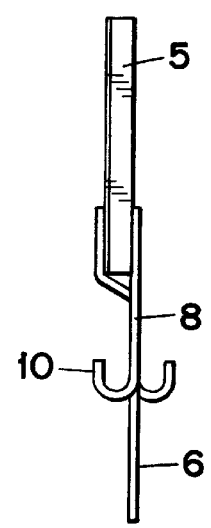
Fig. 5B
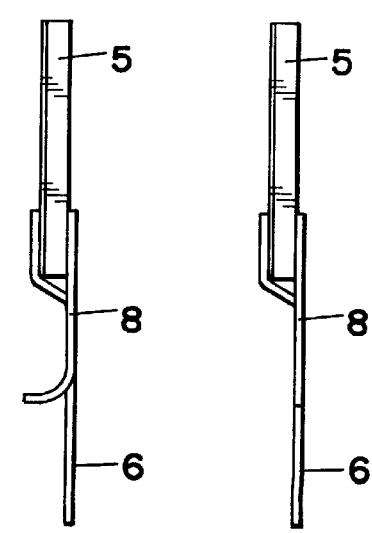
Fig. 5C

ARRANGEMENT FOR MOUNTING A COMPONENT UPSTANDING ON A CARRIER WITH SURFACE MOUNTED LEADS

This application is a divisional of application Ser. No. 08/977,235, filed Nov. 24, 1997, now U.S. Pat. No. 6,010,920.

FIELD OF INVENTION

The present invention relates to a method of surface mounting an upstanding component on a carrier, and also to an arrangement for surface mounting an upstanding component on a carrier.

DESCRIPTION OF THE PRIOR ART

Present day components that are intended to be mounted upstanding on a circuit board for instance often have straight leads for insertion into holes such as to affix the component on the board and to establish an electric contact between component and board. The leads may be disposed in a Single-In Line formation (SIL formation). In mounting such a component on a circuit board, the leads are inserted into metallized holes provided in the board and the component is held firmly in the holes through the interaction of the leads, an electrical connection being established in the holes so as to obtain the requisite electrical contact between component leads and circuit board.

SUMMARY OF THE INVENTION

There is a trend in the electronics industry toward the preference for surface mountable components that can be mounted on such carriers as circuit boards. Components of this nature take up less space on a circuit board as seen totally, since it obviates the need to provide a large number of holes for instance. Such holes may make the drawing of conductors in underlying layers difficult to achieve. Furthermore, it is possible to rationalise circuit board production processes when solely surface mounted components can be used. Because hole mounting processes and wave soldering processes can be dispensed with, production is both simpler and less costly.

By using surface mountable leads on a component in conjunction with a "Single-In-Line" technique, wherewith the leads may be bent at their bottom extremities and provided with feet for contact with the circuit board, and wherewith guide/support pins are used to hold the component mechanically in place during the process of mounting and connecting the component and to brace the leads on the finished board, it is possible to mount an upstanding component on a circuit board with the component leads surface mounted on the board.

The surface mounted contact leads may be produced from existing lead frames or specially adapted contact leads. The leads may be bent to an appropriate shape with the aid of tools for forming feet on the respective leads, such that the leads will be connected effectively to board connection surfaces and be independent of the position taken by the component when mounted.

The guide and support pins will preferably be two or more in number and may be straight or slightly curved, but will always be longer than the connecting leads so that they can be inserted into guide holes in the circuit board. The guide and support pins enable the component to be mounted without the aid of loose fixtures. The use of a guide and support pin with few leads is also conceivable, depending on the field of use and the size of the component concerned.

BRIEF DESCRIPTION OF THE DRAWINGS

FIGS. 1A and B are separate views of a component mounted on a lead frame.

FIGS. 2A, B illustrate the component of FIG. 1 with the leads removed from the lead frame and formed as contact leads and guide and support pins in accordance with the invention.

FIGS. 3A and 3B are views which show the component of FIG. 2 mounted on and connected to a circuit board.

FIGS. 4A and B show alternative embodiments of the guide and support pins.

FIGS. 5A–5C show alternative embodiments of the contact leads.

DETAILED DESCRIPTION OF PREFERRED EMBODIMENTS

Seen totally, surface mounted components utilize less space than hole mounted components, since the surface of an underlying circuit board layer can be better used for circuit drawing. When greater possibility of surface mounting components is found in the production of circuit boards, there is also found potential for rationalising production since all components can then be surface mounted and processes relating to hole-mounting and wave-soldering can be dispensed with in the manufacturing line.

With a starting point from, e.g., rolled strip material that comprises essentially several longitudinally combined lead frame material (see FIG. 1) each individual contact point 3 of the contact leads 2 in the lead frame 1 is first connected to a respective contact surface 4 on the component 5 subsequent to having removed any non-functional lead. The contact points 3 on the contact leads 2 of the lead frame can be soldered firmly to respective contact points 4 of the component. Individual components 5 are removed from the frame-connected components and tested, see. FIG. 2, e.g. clipped therefrom. This can be done in part immediately prior to or during the packing process, depending on the packing process applied. By allowing at least one lead to constitute a guide and support pin 6 adapted for hole-mounting in a circuit board 7 with possible electrical connection to said board, remaining leads can be used as electric contact leads 8 between component and board.

Existing lead frames can thus be used for components that are to be surface mounted. Alternatively, contact leads and guide and support pins can be applied externally directly to the component for connection therewith. For the purpose of holding the components in place on a carrier, there are conveniently used two guide pins 6 which may have been formed from a lead that would normally have been clipped off. The guide pins may be straight or slightly curved or angled as shown at 6', see FIG. 4A, where the contact points and guide holes are in line on the carrier, for instance. In certain cases, it may be suitable to place the component upstanding directly on the carrier and therewith use shortened contact leads and guide-support pins, see FIG. 4B.

Guide-and-support pin receiving holes 9 have been drilled in the circuit board 7 to facilitate mounting of components 5 on said board, said pins and holes functioning to guide and support the components in their intended positions on the board. The holes 9 in the circuit board will preferably not be metallised, so as to maintain the correct hole size. The size of the guide holes may be varied in accordance with lead frames and the tolerance requirements of the assembly machines used by a circuit board manufacturer.

Despite the necessity of drilling guide holes in the circuit board, there is still afforded a saving on the part of the circuit board manufacturer, by. virtue of the fact that a large number of holes that would otherwise be needed for hole-mounting components are not now needed. The provision of guide holes in circuit boards would not seem to present a disadvantage, since the boards must always be subjected to a drilling operation in order to provide via holes for connections between the various layers of the board.

In addition to the aforesaid method steps of manufacturing components with contact leads 8 and guide and support pins 6, there is required equipment for bending the lead ends 10 and a packaging technique. The ends of the contact leads will preferably have the J-shape shown in FIGS. 3B, 4A and 5A, the gull-wing shape shown in FIG. 5B and the clipped shape with straight leads shown in FIG. 5C, for direct connection to the circuit board. When the component has been mounted on the circuit board, the outwardly projecting free end of the pin may be removed or, when desired, bent/angled to ensure positive connection of the component on the circuit board.

When the ends of the contact leads have the shape of a J, there will always be sufficient surface contact with the connecting surface on the circuit board with which an electric contact can be made. Furthermore, there can be obtained a joint 11 which will have precisely the same amount of connecting material around the joint even if the component leans to one side or the other. The guide pins can be left completely straight or may be bent slightly so as to lie in line with the centre of the J-bend. An alternative to the J-shape is one in which the J-bends are in mirror image with one another, as shown in FIG. 5A, which would also contribute towards obtaining a more stable placement of the component on the circuit board. Similar mirror-image configurations that contribute towards enhancing the stability of the component are also conceivable, e.g. mirror-image gull wing shapes and other similar shapes of the lead ends.

When packaging finished components with connected leads and guide and support pins, the pins, which are longer than the contact leads, can be used as contact surfaces for adhesive transporting tape, and the finished components wound up on a transport reel and then transported to the user.

What is claimed is:

1. An arrangement for surface mounting a component upstanding on a carrier, characterized in that leads (2) are connected to the component (5), wherein at least one lead is adapted to form a guide and support pin (6) and the remaining leads function as contact leads (8) for connection to the electrical contact points (4) of the component (5), wherein when mounting the component on the carrier (7), the guide and support pin is inserted into a guide hole (9) in the carrier and contact leads (8) are connected to respective contact points on a top surface plane of the carrier, wherein contact leads do not penetrate said top surface plane; and, wherein said top surface plane is co-planar with the in surface of the carrier.

2. An arrangement according to claim 1, characterized in that when the contact points and guide hole lie in line on the carrier (7), said guide and support pins (6) are angled.

3. An arrangement according to claim 1, characterized in that said guide and support pins (6) are connectable with a band.

4. An arrangement according to claim 1, characterized in that the ends of the contact leads (8) are bent so as to provide better connection with the carrier (7).

5. An arrangement according to claim 4, characterized in that the ends of the contact lead (8) are J-shaped.

6. An arrangement according to claim 4, characterized in that the ends (10) of the contact leads (8) are gull-wing shaped.

7. An arrangement according to any one of claims 4 to 6, characterized in that the ends of the contact leads face in mutually different directions.

8. An arrangement according to claim 1, characterized in that the contact leads are cut so as to be straight for direct connection.

9. An arrangement according to any one of claims 1 to 8, characterized in that prior to mounting, the contact leads (8) and guide and support pins (6) consist of leads (2) on a lead frame (1).

* * * * *